United States Patent
Eng et al.

(10) Patent No.: US 8,525,320 B2
(45) Date of Patent: Sep. 3, 2013

(54) MICROELECTRONIC DIE PACKAGES WITH LEADFRAMES, INCLUDING LEADFRAME-BASED INTERPOSER FOR STACKED DIE PACKAGES, AND ASSOCIATED SYSTEMS AND METHODS

(75) Inventors: Meow Koon Eng, Singapore (SG); Yong Poo Chia, Singapore (SG); Suan Jeung Boon, Singapore (SG); Wuu Yean Tay, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/110,060

(22) Filed: May 18, 2011

(65) Prior Publication Data

US 2011/0215453 A1 Sep. 8, 2011

Related U.S. Application Data (62) Division of application No. 11/923,290, filed on Oct. 24, 2007, now Pat. No. 7,947,529.

(30) Foreign Application Priority Data

Aug. 16, 2007 (SG) .................................. 200706008

(51) Int. Cl.
*H01L 23/02* (2006.01)
(52) U.S. Cl.
USPC .................. 257/686; 257/777; 257/E25.006
(58) Field of Classification Search
USPC ........... 257/686, 777, 778, E25.006, E25.013
See application file for complete search history.

(56) References Cited

U.S. PATENT DOCUMENTS

| | | | |
|---|---|---|---|
| 3,746,934 | A | 7/1973 | Stein |
| 5,107,328 | A | 4/1992 | Kinsman |
| 5,128,831 | A | 7/1992 | Fox, III et al. |
| 5,138,434 | A | 8/1992 | Wood et al. |
| 5,145,099 | A | 9/1992 | Wood et al. |

(Continued)

FOREIGN PATENT DOCUMENTS

| | | |
|---|---|---|
| EP | 0522518 A2 | 1/1993 |
| EP | 1503417 A1 | 2/2005 |
| JP | 60206058 A | 10/1985 |
| JP | 61018164 A | 1/1986 |
| KR | 20020024654 A | 4/2002 |
| TW | I233192 B | 5/2005 |
| TW | I249232 B | 2/2006 |
| WO | 2005017968 A2 | 2/2005 |

OTHER PUBLICATIONS

International Search Report and Written Opinion issued Mar. 23, 2009 in International Application No. PCT/US2008/071609.

(Continued)

*Primary Examiner* — Hoai V Pham
(74) *Attorney, Agent, or Firm* — Perkins Coie LLP (57) ABSTRACT

Microelectronic die packages, stacked systems of die packages, and methods of manufacturing thereof are disclosed herein. In one embodiment, a method of manufacturing a microelectronic device includes stacking a first die package having a first dielectric casing on top of a second die package having a second dielectric casing, aligning first metal leads at a lateral surface of the first casing with second metal leads at a second lateral surface of the second casing, and forming metal solder connectors that couple individual first leads to individual second leads. In another embodiment, the method of manufacturing the microelectronic device may further include forming the connectors by applying metal solder to a portion of the first lateral surface, to a portion of the second lateral surface, and across a gap between the first die package and the second die package so that the connectors are formed by the metal solder wetting to the individual first leads and the individual second leads.

18 Claims, 9 Drawing Sheets

(56) References Cited

U.S. PATENT DOCUMENTS

| | | |
|---|---|---|
| 5,252,857 A | 10/1993 | Kane et al. |
| 5,356,838 A | 10/1994 | Kim |
| 5,518,957 A | 5/1996 | Kim |
| 5,554,886 A | 9/1996 | Song et al. |
| 5,593,927 A | 1/1997 | Farnworth et al. |
| 5,677,566 A | 10/1997 | King et al. |
| 5,760,471 A | 6/1998 | Fujisawa et al. |
| 5,801,439 A | 9/1998 | Fujisawa et al. |
| 5,807,762 A | 9/1998 | Akram et al. |
| 5,811,877 A | 9/1998 | Miyano et al. |
| 5,826,628 A | 10/1998 | Hamilton |
| 5,835,988 A | 11/1998 | Ishii et al. |
| 5,851,845 A | 12/1998 | Wood et al. |
| 5,879,965 A | 3/1999 | Jiang et al. |
| 5,883,426 A | 3/1999 | Tokuno et al. |
| 5,891,797 A | 4/1999 | Farrar |
| 5,894,218 A | 4/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,986,209 A | 11/1999 | Tandy |
| 5,990,566 A | 11/1999 | Farnworth et al. |
| 5,994,784 A | 11/1999 | Ahmad |
| RE36,469 E | 12/1999 | Wood et al. |
| 6,002,167 A | 12/1999 | Hatano et al. |
| 6,004,867 A | 12/1999 | Kim et al. |
| 6,008,070 A | 12/1999 | Farnworth |
| 6,018,249 A | 1/2000 | Akram et al. |
| 6,020,624 A | 2/2000 | Wood et al. |
| 6,020,629 A | 2/2000 | Farnworth et al. |
| 6,028,352 A | 2/2000 | Eide |
| 6,028,365 A | 2/2000 | Akram et al. |
| 6,030,858 A | 2/2000 | Cha et al. |
| 6,048,744 A | 4/2000 | Corisis et al. |
| 6,051,878 A | 4/2000 | Akram et al. |
| 6,064,194 A | 5/2000 | Farnworth et al. |
| 6,066,514 A | 5/2000 | King et al. |
| 6,072,233 A | 6/2000 | Corisis et al. |
| 6,072,236 A | 6/2000 | Akram et al. |
| 6,089,920 A | 7/2000 | Farnworth et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,122 A | 8/2000 | Wood et al. |
| 6,111,312 A | 8/2000 | Hirumuta et al. |
| 6,124,634 A | 9/2000 | Akram et al. |
| 6,130,474 A | 10/2000 | Corisis |
| 6,133,068 A | 10/2000 | Kinsman |
| 6,133,622 A | 10/2000 | Corisis et al. |
| 6,146,919 A | 11/2000 | Tandy |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,175,149 B1 | 1/2001 | Akram |
| 6,184,465 B1 | 2/2001 | Corisis |
| 6,187,615 B1 | 2/2001 | Kim et al. |
| 6,188,232 B1 | 2/2001 | Akram et al. |
| 6,198,172 B1 | 3/2001 | King et al. |
| 6,201,304 B1 | 3/2001 | Moden |
| 6,212,767 B1 | 4/2001 | Tandy |
| 6,214,716 B1 | 4/2001 | Akram |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,666 B1 | 5/2001 | Corisis et al. |
| 6,235,552 B1 | 5/2001 | Kwon et al. |
| 6,235,554 B1 | 5/2001 | Akram et al. |
| 6,239,489 B1 | 5/2001 | Jiang |
| 6,246,108 B1 | 6/2001 | Corisis et al. |
| 6,246,110 B1 | 6/2001 | Kinsman et al. |
| 6,247,629 B1 | 6/2001 | Jacobson et al. |
| 6,252,772 B1 | 6/2001 | Allen |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,766 B1 | 7/2001 | Moden |
| 6,271,580 B1 | 8/2001 | Corisis |
| 6,281,042 B1 | 8/2001 | Ahn et al. |
| 6,281,577 B1 | 8/2001 | Oppermann et al. |
| 6,284,571 B1 | 9/2001 | Corisis et al. |
| 6,285,204 B1 | 9/2001 | Farnworth |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,313,998 B1 | 11/2001 | Kledzik et al. |
| 6,320,251 B1 | 11/2001 | Glenn |
| 6,326,697 B1 | 12/2001 | Farnworth |
| 6,326,698 B1 | 12/2001 | Akram |
| 6,329,222 B1 | 12/2001 | Corisis et al. |
| 6,329,705 B1 | 12/2001 | Ahmad |
| 6,331,221 B1 | 12/2001 | Cobbley |
| 6,331,448 B1 | 12/2001 | Ahmad |
| 6,344,976 B1 | 2/2002 | Schoenfeld et al. |
| 6,388,333 B1 | 5/2002 | Taniguchi et al. |
| 6,407,381 B1 | 6/2002 | Glenn et al. |
| 6,429,528 B1 | 8/2002 | King et al. |
| 6,432,796 B1 | 8/2002 | Peterson |
| 6,433,418 B1 | 8/2002 | Fujisawa et al. |
| 6,437,449 B1 | 8/2002 | Foster |
| 6,437,586 B1 | 8/2002 | Robinson |
| 6,483,044 B1 | 11/2002 | Ahmad |
| 6,487,078 B2 | 11/2002 | Kledzik et al. |
| 6,503,780 B1 | 1/2003 | Glenn et al. |
| 6,548,376 B2 | 4/2003 | Jiang |
| 6,548,757 B1 | 4/2003 | Russell et al. |
| 6,552,910 B1 | 4/2003 | Moon et al. |
| 6,560,117 B2 | 5/2003 | Moon et al. |
| 6,564,979 B2 | 5/2003 | Savaria |
| 6,576,531 B2 | 6/2003 | Peng et al. |
| 6,607,937 B1 | 8/2003 | Corisis |
| 6,614,092 B2 | 9/2003 | Eldridge et al. |
| 6,652,910 B2 | 11/2003 | Pan et al. |
| 6,717,275 B2 | 4/2004 | Matsuura et al. |
| 6,746,894 B2 | 6/2004 | Yin et al. |
| 6,864,566 B2 | 3/2005 | Choi et al. |
| 6,885,107 B2 | 4/2005 | Kinsman |
| 6,900,530 B1 | 5/2005 | Tsai |
| 7,006,360 B2 | 2/2006 | Kim |
| 7,015,587 B1 | 3/2006 | Poddar |
| 7,119,427 B2 | 10/2006 | Kim |
| 7,145,227 B2 | 12/2006 | Ebihara et al. |
| 7,394,148 B2 | 7/2008 | Karnezos |
| 7,615,862 B2 | 11/2009 | Huang et al. |
| 7,843,050 B2 | 11/2010 | Eng et al. |
| 2002/0096760 A1 | 7/2002 | Simelgor et al. |
| 2005/0101056 A1 | 5/2005 | Song et al. |
| 2005/0242421 A1 | 11/2005 | Tandy |
| 2006/0068527 A1 | 3/2006 | Cobbley et al. |
| 2006/0138628 A1 | 6/2006 | Tzu |
| 2007/0013038 A1 | 1/2007 | Yang |
| 2007/0108560 A1 | 5/2007 | Tang et al. |
| 2007/0210441 A1 | 9/2007 | Corisis et al. |
| 2009/0026600 A1 | 1/2009 | Koon et al. |
| 2009/0045489 A1 | 2/2009 | Koon et al. |

OTHER PUBLICATIONS

Unisemicon, Product Information, Stack Package Product for DDR/DDR2, 2 pages, retrieved from the Internet on May 30, 2006, <http://www.unisemicon.com/wizhome/menu_48.html>.

Search Report and Written Opinion issued May 25, 2009 in Singapore Application No. 200706008-0.

Office Action issued Jun. 25, 2012 in Taiwan Application No. 097131336, 15 pages.

Office Action issued Oct. 22, 2012 in Taiwan Application No. 097131336, 9 pages.

MICROELECTRONIC DIE PACKAGES WITH LEADFRAMES, INCLUDING LEADFRAME-BASED INTERPOSER FOR STACKED DIE PACKAGES, AND ASSOCIATED SYSTEMS AND METHODS

CROSS-REFERENCE TO RELATED APPLICATIONS

This application is a divisional of U.S. application Ser. No. 11/923,290 filed Oct. 24, 2007, now U.S. Pat. No. 7,947,529, which claims foreign priority benefits of Republic of Singapore Application No. 200706008-0 filed Aug. 16, 2007, each of which is incorporated herein by reference in its entirety.

TECHNICAL FIELD

The present disclosure is directed generally to microelectronic die packages with leadframes, and more particularly to leadframes configured for stacked die packages.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

In one conventional arrangement, the die is mounted to a supporting substrate (e.g., a printed circuit board), and the die bond pads are electrically coupled to corresponding bond pads of the substrate with wirebonds. After encapsulation, the substrate can be electrically connected to external devices with solder balls or other suitable connections. Accordingly, the substrate supports the die and provides an electrical link between the die and the external devices.

In other conventional arrangements, the die can be mounted to a leadframe that has conductive lead fingers connected to a removable frame. The frame temporarily supports the lead fingers in position relative to the die during manufacture. Each lead finger is coupled to a corresponding bond pad of a die (e.g., via a wire bond or a metal redistribution layer), and the assembly is encapsulated in such a way that the frame and a portion of each of the lead fingers extend outside the encapsulating material. The frame is then trimmed off, and the exposed portions of each lead finger connect the die to external components. In general, individual lead fingers can be bent and then coupled to a corresponding external bond pad.

Die manufacturers have come under increasing pressure to reduce the size of dies and the volume occupied by the dies, and to increase the capacity of the resulting encapsulated assemblies. To meet these demands, die manufacturers often stack multiple dies on top of each other to increase the capacity or performance of the device within the limited surface area on the circuit board or other element to which the dies are mounted.

DETAILED DESCRIPTION

Specific details of several embodiments of the disclosure are described below with reference to semiconductor devices and methods for fabricating semiconductor devices. The semiconductor components are manufactured on semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash memory (e.g., NAND flash memory), processors, imagers, and other types of devices can be constructed on semiconductor wafers. Although many of the embodiments are described below with respect to semiconductor devices that have integrated circuits, other types of devices manufactured on other types of substrates may be within the scope of the invention. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the features shown and described below with reference to FIGS. 1A-13.

Figures 1A, 1B:
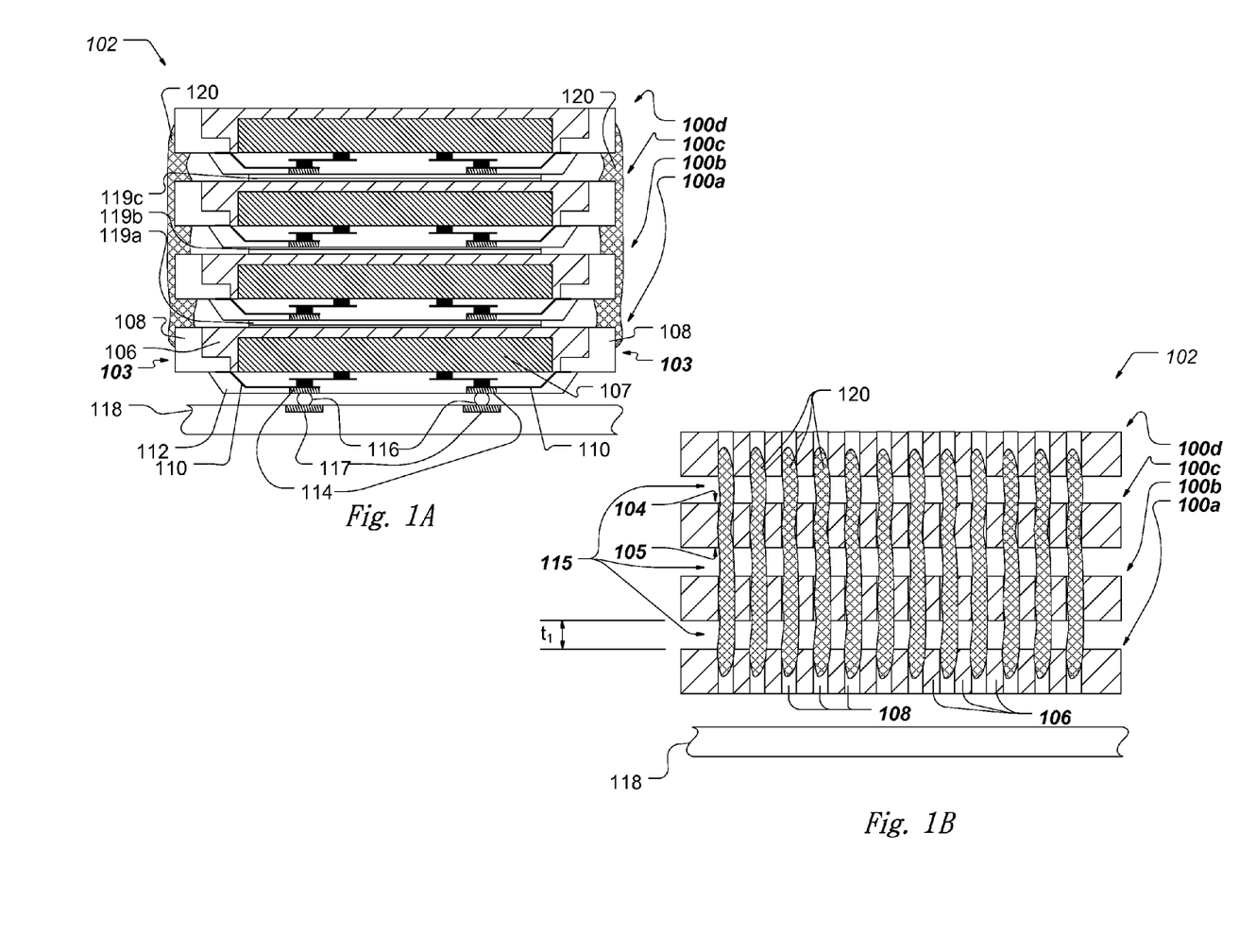
FIGS. 1A and 1B are cross-sectional side views of a stacked system that includes microelectronic die packages configured and stacked in accordance with an embodiment of the disclosure.

FIGS. 1A and 1B are cross-sectional side views of one embodiment of a stacked system 102 having a plurality of die packages 100 (identified individually by reference numbers 100a-d). Individual die packages 100 can include a microelectronic die 107, a molded dielectric casing 106, and metal leads 108 (or metal contacts) that are spaced apart from lateral sides of the die 107. The casing 106 has lateral sides 103, a top side 104, and a bottoms side 105, and the casing 106 encapsulates at least a portion of the die 107 and the leads 108. The die packages 100 further include metal traces 110 that electrically couple the leads 108 to the die 107 and a dielectric spacer layer 112 encasing the traces 110 and a portion of an active side of the die 107. The die packages 100 can also include package bond pads 114 coupled to the traces 110. The stacked system 102, for example, has an interposer substrate 118 with metal bump pads 117 electrically connected to the bond pads 114 at the first die package 100a by bond pad connections 116.

The stacked system 102 shown in FIGS. 1A and 1B includes the four stacked die packages 100a-d physically coupled together, at least in part, by adhesive layers 119a-c, and the leads 108 of the die packages 100a-d electrically coupled together by external inter-package connectors 120. The connectors 120, for example, can be metal solder lines that wet to lateral contact surfaces of the leads 108 at the lateral sides 103 of the casing 106, but do not wet to the casing 106 itself. In this embodiment, the connectors 120 form along at least the lateral contact surfaces of sets of vertically aligned leads 108 and across die package gaps 115 between such vertically aligned leads 108 to electrically bridge the die packages 100a-d. Thus, the bonds 116 are electrically coupled to microelectronic dies within the die packages 100a-d through conduction paths that include the leads 108 and the connectors 120. As shown in FIGS. 1A and 1B, the external inter-package connectors 120 may also attach to top and bottom contact surfaces of the leads 108 at the top and bottom surfaces 104-105 of the casing 106, respectively. In alternative embodiments, the connectors 120 may attach only to the portion of the leads 108 flush with the lateral surfaces 103 of the casing 106, or combinations of the surfaces of the leads 108 at the lateral, top, and bottom surfaces 103-105 of the casing 106. Accordingly, several embodiments of the connectors 120 have a portion that projects at least laterally outward from the lateral edges of the die package 100a-d and another portion that extends between the top and bottom sides of individual die packages 100a-d.

The stacked system 102 may be formed by a method that includes stacking the die packages 100a-d, aligning the leads 108 of the die packages 100a-d, and forming the connectors 120 at individual leads 108 of the die packages 100a-d. Stacking and aligning the leads 108 may include stacking the die packages 100a-d in sequence so that the leads 108 are placed above and/or below leads on a corresponding die package. Forming the connectors 120 may be carried out, for example, using wave or reflow soldering processes. Using wave soldering, a pumped wave or cascade of liquid-phase metal solder can be applied across lateral sides of the die packages 100a-d. Using reflow soldering, solder paste having metal powder particles can be applied across the lateral sides of the die packages 100a-d and then heated to melt the metal particles. In these, or other soldering processes, the metal solder selectively wets (e.g., when heated) to the higher energy surfaces associated with the leads 108 and not to the lower energy surfaces associated with the casing 106. When the metal solder cools, the connectors 120 are formed across individual leads 108. A die package spacing distance $t_1$ of 60 microns, for example, may ensure that the surface tension associated with the applied solder allows the connectors 120 to bridge between the leads 108.

In general, and in contrast to the stacked system 102, conventional methods of stacking packages or dies have been challenging and expensive, and even then misalignments occur. For example, conventional leads need to be accurately aligned, and thus attaching a conventional lead on one package to a conventional lead on a corresponding package is time-intensive. Also, because individual leads occupy only a small surface area, each conventional lead-to-lead interconnection needs to be carefully inspected. The process of stacking conventional packages is also difficult to standardize because dies are made in a variety of sizes, and packages likewise vary in size. Thus, the process of stacking and interconnecting conventional packages needs to be tailored to an arrangement of a particular package type.

By using the leads 108 as a framework for interconnecting devices, however, several embodiments of microelectronic die packages 100 can overcome these and other issues related to conventional die package stacking. For example, because the leads 108 are exposed at lateral surface portions of the casing 106, each set of leads can be electrically coupled together using a simple soldering process to intercouple the die packages 100a-d. Also, because the connectors 120 can selectively wet to the conductive leads 108 but not attach to the casing 106 between the leads 108, the lead-to-lead interconnections are reliable and do not require the same alignment tolerances as conventional lead-to-lead inspection. The leads 108 can further establish the exterior package dimensions such that a standardized package size may be used to house a variety of differently sized dies, an example of which is described further with reference to FIG. 10.

Figure 2A:
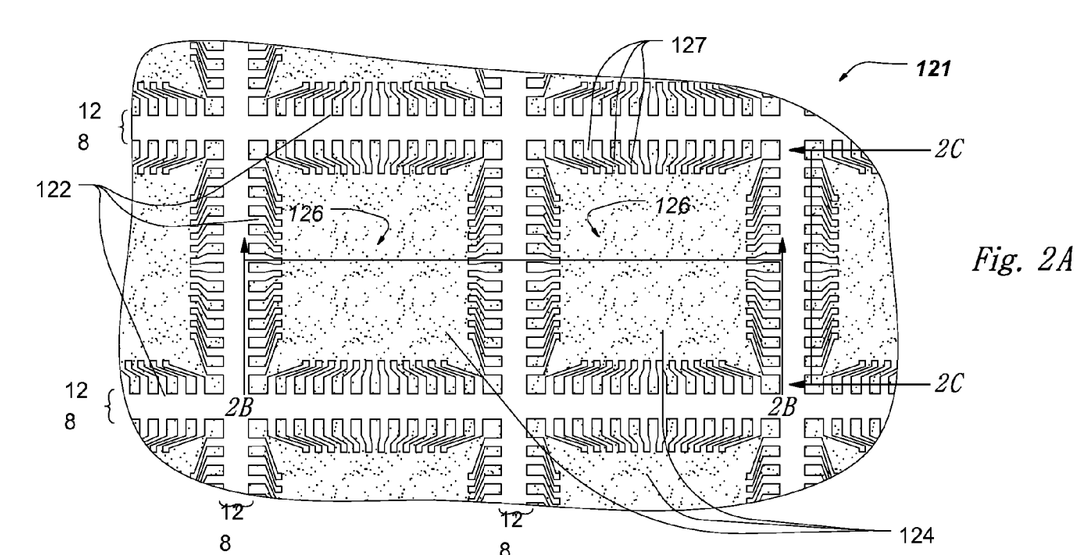
FIG. 2A is a top view of a microelectronic assembly that includes a frame, a release layer, and a support substrate.

FIGS. 2A-8 illustrate stages of forming the microelectronic die package 100a in accordance with one embodiment of the disclosure. FIG. 2A is a top view of a microelectronic assembly 121 that includes a metal frame 122 and a release layer 124. The frame 122 comprises openings 126, metal lead portions 127, and dicing lanes 128. The openings 126 expose a portion of the release layer 124 for attaching and positioning the die 107 adjacent to the lead portions 127, and the dicing lanes 128 provide a cutting or cleavage path for singulating the individual die package 100a from the frame 122 (described further with reference to FIG. 8). In one embodiment, the frame 122 may be made from copper and may include selective copper plating along the lead portions 127. In other embodiments, the frame 122 may comprise a variety of other metallic materials such as aluminum or an aluminum-copper alloy. The release layer 124 may be, for example, a thermal or UV release film.

Figure 2B:
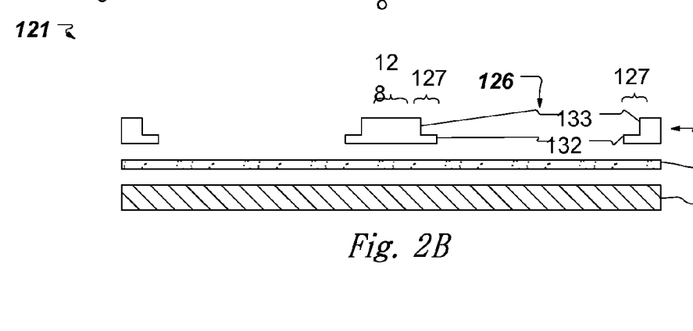
FIGS. 2B and 2C are partially exploded cross-sectional side views of the assembly of FIG. 2A.
Figure 2C:
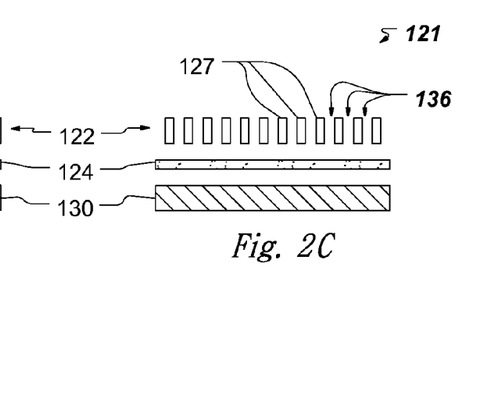

FIGS. 2B and 2C are partially exploded cross-sectional side views of the assembly 121 showing the frame 122, the release layer 124, and a support substrate 130 (e.g., a silicon wafer or other type of structure having planar surface). FIGS. 2B and 2C also show individual dicing lane 128, first tier and second tier portions 132-133 of the lead portions 127, and gaps 136 between individual lead portions 127. The first and second tier portions 132-133, the gaps 136, and the support substrate 130 define bottom and lateral sides of a cavity, which will be subsequently filled with a dielectric material (described further with reference to FIGS. 4A-C).

Figure 3A:
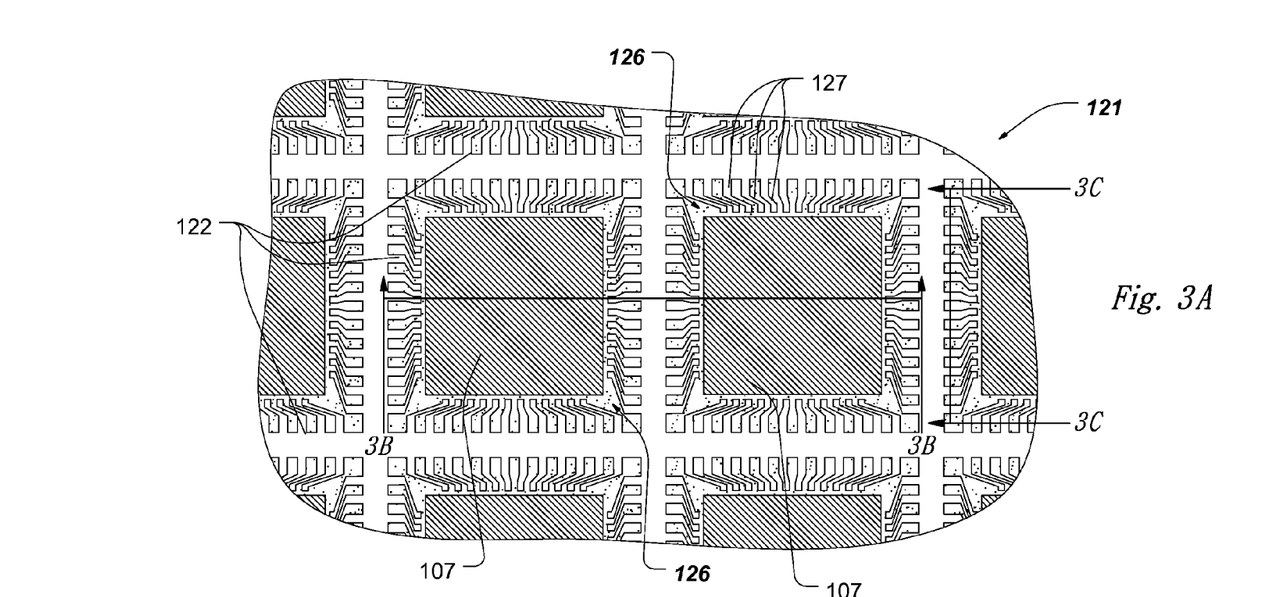
FIG. 3A is a top view of the assembly of FIG. 2A having microelectronic dies positioned within openings of the frame.
Figure 3B:
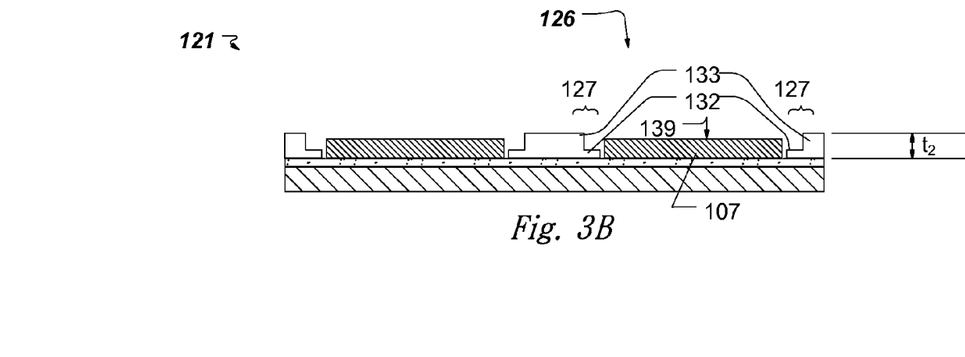
FIGS. 3B and 3C are cross-sectional side views of the assembly of FIG. 3A.
Figure 3C:
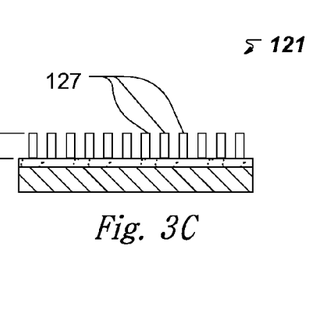

FIG. 3A is a top view of the assembly 121 after microelectronic die placement. FIG. 3A, more specifically, shows the frame 122, the lead portions 127, and the openings 126, with individual dies 107 placed within the openings 126 and adjacent to the lead portions 127. FIGS. 3B and 3C are cross-sectional side views further showing the openings 126, the first tier and second tier portions 132-133 of the lead portions 127, and a top-side surface 139 of the dies 107. The first tier portions 132 are below the top-side surface 139 of the dies 107 and the second tier portions 133 extend above the top-side surface 139. In one embodiment, the second tier portions 133 may have a thickness $t_2$ in the range of about 250 to 1000 microns. In another embodiment, $t_2$ could be on the order of 650 microns or larger, which would eliminate a need for backgrinding the dies 107. In addition, it is also contemplated that the first and second tier portions 132-133 could have thicknesses that are configured to promote heat conduction away from the dies 107.

Figure 4A:
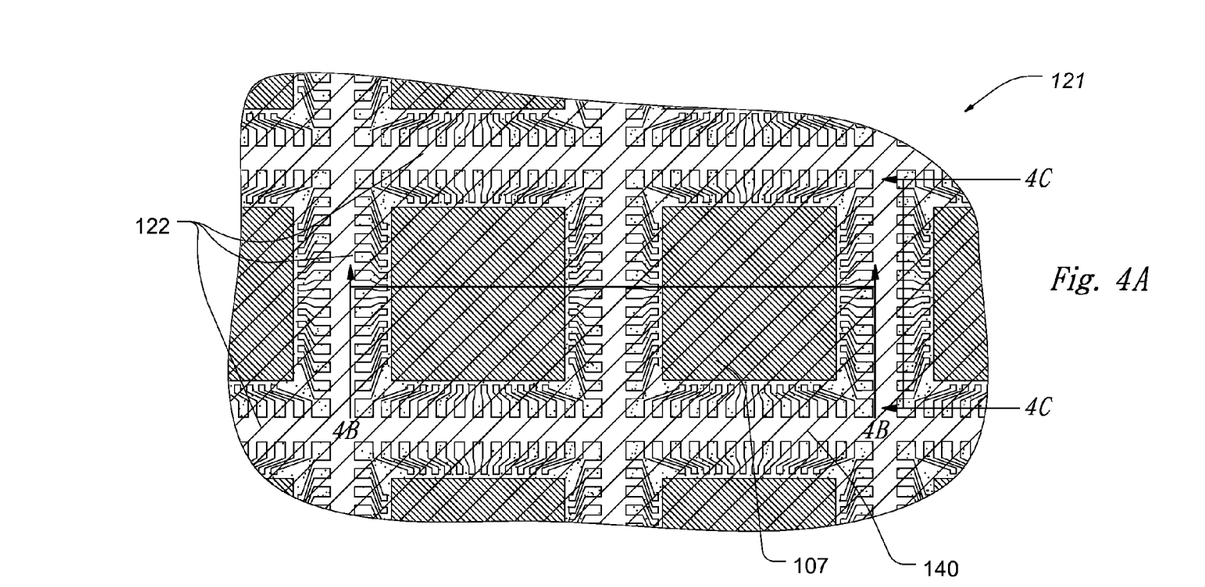
FIG. 4A is a top view of the assembly of FIG. 3A encapsulated in a dielectric material.
Figure 4B:
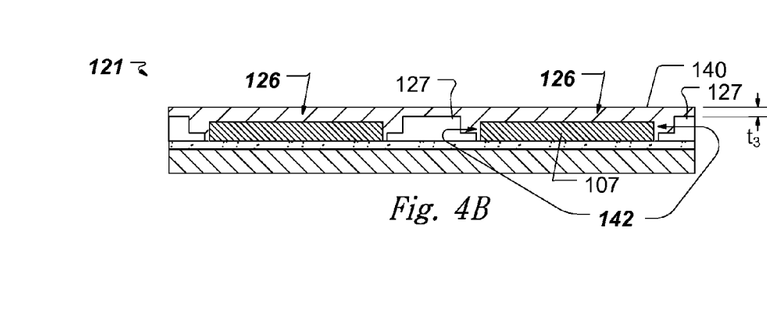
FIGS. 4B and 4C are cross-sectional side views of the assembly of FIG. 4A.
Figure 4C:
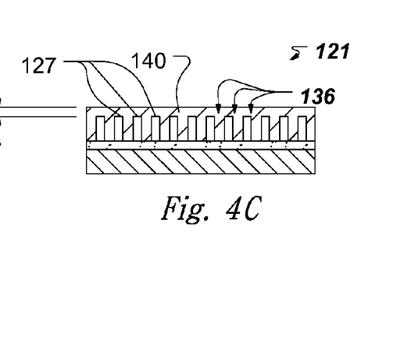

FIG. 4A is a top view of the assembly 121 after a dielectric material 140 has been formed on a top side of the metal frame 122 and a top side of the dies 107. The dielectric material 140, for example, may be a polymer or plastic that is heated and subsequently deposited on top of and within the gaps of the frame 122. The dielectric material 140, for example, can be molded over the frame 122 and the top sides of the dies 107. FIGS. 4B and 4C are cross-sectional side views showing the dielectric material 140 filling the openings 126 around the dies 107 and the gaps 136 between the lead portions 127. After curing and/or cooling, the hardened dielectric material 140 should form a protective and electrically isolative covering over the dies 107, within gaps between lateral sides 142 of the dies 107 and the lead portions 127, and within the gaps 136. To ensure that all of the leads and dies within the assembly 121 are encapsulated, the dielectric material 140 may optionally extend above the lead portions 127 by a thickness $t_3$.

Figure 5A:
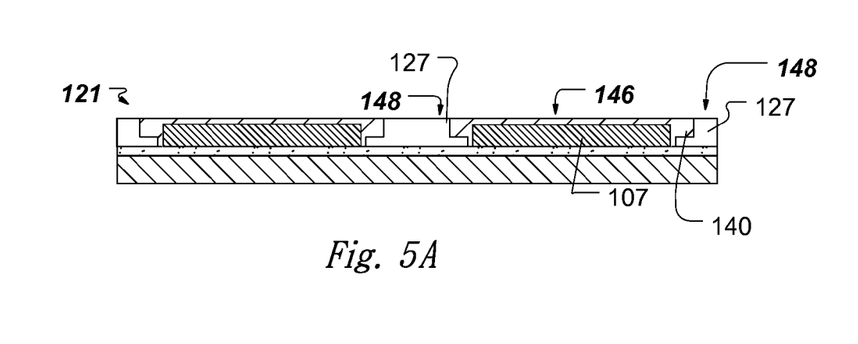
FIGS. 5A and 5B are cross-sectional side views of the assembly of FIG. 4A after partial removal of the dielectric material.
Figure 5B:
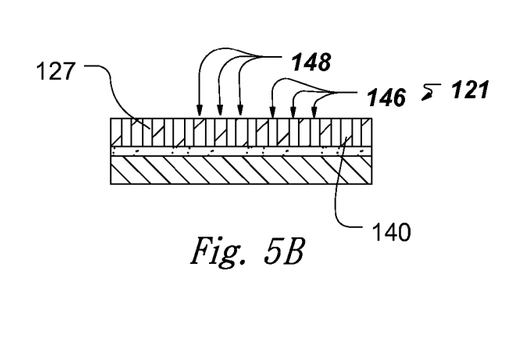

FIGS. 5A and 5B are cross-sectional side views of the assembly 121 after partial removal of the dielectric material 140 that show a top-side surface 146 of the dielectric material 140 flush with a top-side surface 148 of the lead portions 127. A backgrinding process, chemical etch, or chemical-mechanical polishing process may remove the upper portion of the dielectric material 140 to create the planar surface 146 for package-to-package stacking and to expose the top-side surface portions 148 of the lead portions 127 for electrical coupling between individual die packages.

Figure 6A:
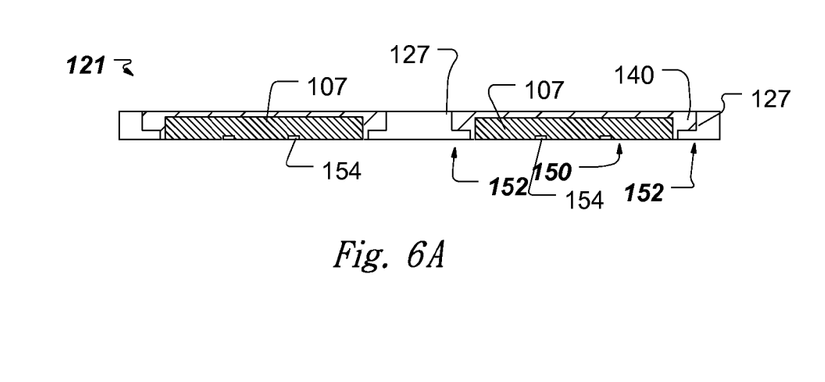
FIGS. 6A and 6B are cross-sectional side and bottom views of the assembly of FIGS. 5A and 5B after removing the support substrate.
Figure 6B:
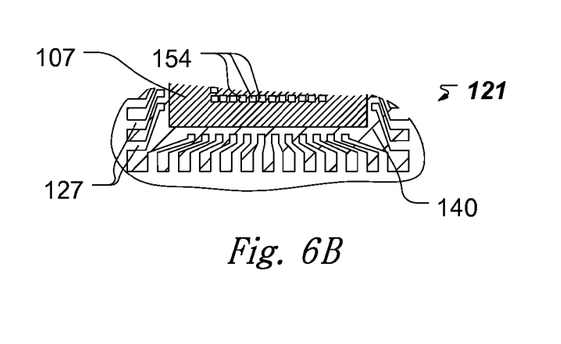

FIGS. 6A and 6B are cross-sectional side and bottom views of the assembly 121 after removing the release layer 124 and the support substrate 130 to expose a bottom-side surface 150 (e.g., active side) of the dies 107 and expose bottom-side surfaces 152 of the lead portions 127. The bottom-side surfaces 150 of the dies 107 include bond pads 154 (or active features) electrically coupled to an integrated circuit within the dies 107 (not shown). The dielectric material 140 holds the dies 107 in place and separates the dies 107 from the lead portions 127.

Figure 7A:
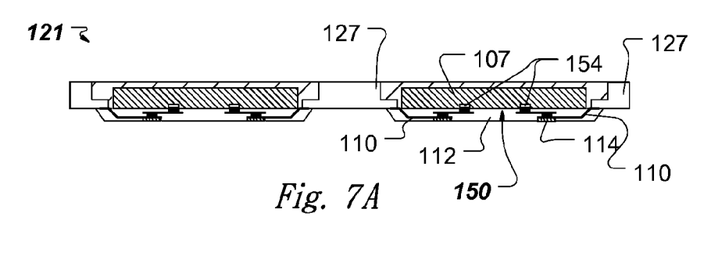
FIG. 7A is a cross-sectional side view of the assembly of FIGS. 6A and 6B after forming a spacer layer.

FIG. 7A is a cross-sectional side view of the assembly 121 after forming an embodiment of the dielectric spacer layer 112 at the bottom-side surface 150 of the dies 107. The spacer layer 112 includes metal traces 110 electrically coupling the bond pads 154 to the lead portions 127 and the package bond pads 114. The spacer layer 112 may be made from a material such as a non-conductive oxide or polymer. The metal traces 110 and the package bond pads 114, for example, may be made from copper or aluminum. The spacer layer 112 can accordingly be a redistribution structure. It is also contemplated that in certain embodiments, the package bond pads 114 may be omitted. For example, in FIG. 1A the package bond pads of the die packages 100b-d could be omitted because these pads are not electrically connected to any external bond pads.

Figure 7B:
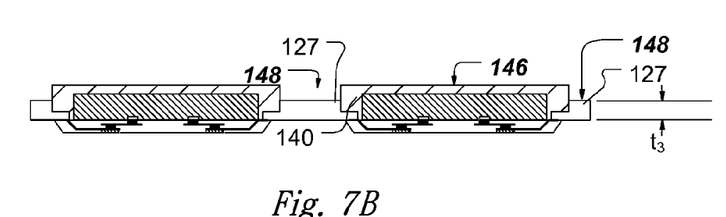
FIG. 7B is a cross-sectional side view of the assembly of FIG. 7A after lead thinning in accordance with an alternative embodiment of the disclosure.

FIG. 7B is a cross-sectional side view that illustrates an additional or alternative stage in forming a microelectronic die package in accordance with another embodiment. In this embodiment, the lead portions 127 are thinned to a thickness so that the dielectric material 140 extends above the top-side surfaces 148 of the lead portions 127 and retains the planar surface 146 attained in the stage of FIGS. 5A-B. A chemical etch, for example, may thin the lead portions 127 without removing material from the dielectric material.

Figure 8:
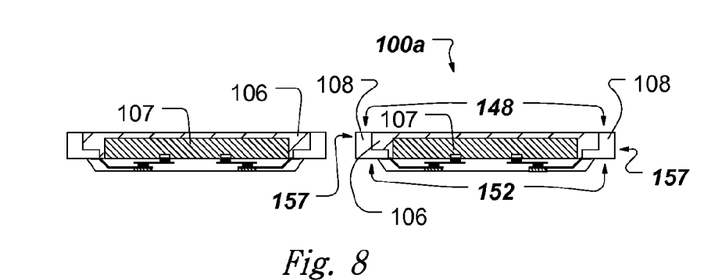
FIG. 8 is a cross-sectional side view of the assembly of FIG. 7A after singulation.

FIG. 8 is a cross-sectional side view of the package 100a after singulation through the dicing lanes 128 (e.g., by a dicing saw or a chemical etch) to yield separated dies 107 housed in casings 106 and coupled to the leads 108. The singulation process forms exposed surface portions 157 of the leads 108 along the lateral edges of the casings. The top- and bottom-side surfaces 148 and 152 of the leads 108 can also be exposed or otherwise accessible. Accordingly, the die package 100a may be placed within a stacked system, such as the stacked system 102, and the connectors 120 can be formed along the die package 100a at any of the surfaces 148, 152, and 157.

Many variations may be made to the stacked system 102. For example, in lieu of the bond pad connections 116 shown in FIG. 1A, wire bonds may electrically couple the stacked system 102 to an interposer substrate. In other embodiments, the adhesive layers 119a-c interposed between the stacked packages may not be necessary. The connectors 120 alone, for example, could be used to hold the individual die packages 100a-d together by temporarily clamping the packages 100a-d until metal solder is applied and the connectors 120 are formed. Also, the stacked system may include any number of individual microelectronic die packages having more or fewer packages than those presented in the illustrated embodiments.

In another embodiment, the stacked system 102 includes packages that house the same type of die. For example, the stacked system 102 could be a memory, such as a static dynamic access memory (SRAM). In this embodiment, the leads 108 would provide word and bit line access to individual SRAM dies housed in the die packages 100a-d. Accordingly, the aggregated individual SRAM dies form a large SRAM, which has a reduced footprint relative to a conventional SRAM of the same size.

Figures 9, 10:
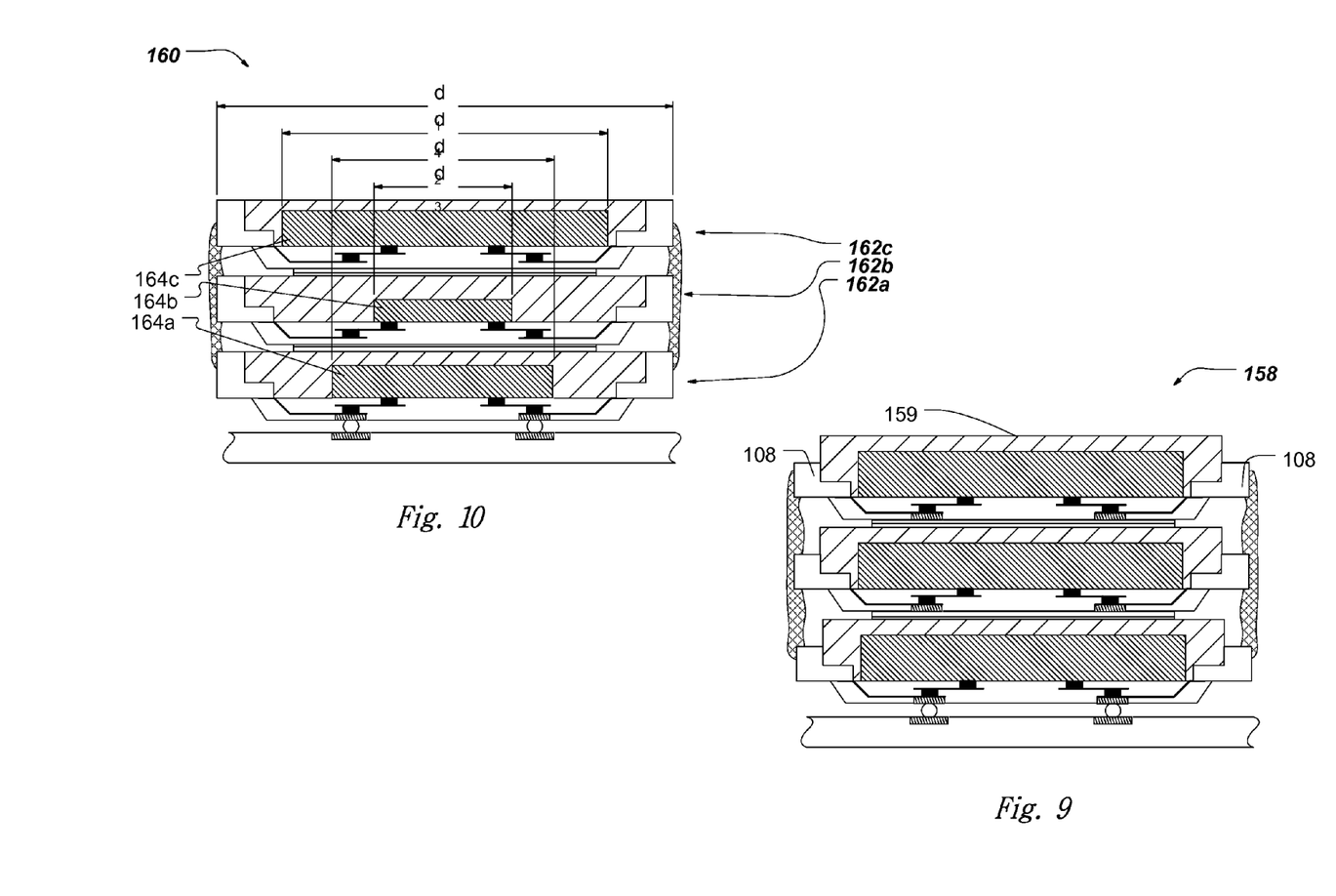
FIG. 9 is a cross-sectional side view of a stacked system that includes microelectronic die packages configured and stacked in accordance with an alternative embodiment of the disclosure.
FIG. 10 is a cross-sectional side view of a stacked system having microelectronic die packages that include dies of different sizes in accordance with an embodiment of the disclosure.

FIG. 9 is a cross-sectional side view showing an alternative embodiment of a stacked system 158 including microelectronic die packages formed in accordance with the additional, alternative stage described with reference to FIG. 7B and having a casing 159 that extends above the leads 108. Thus, this embodiment may be used, for example, to stack microelectronic die packages that house thick or non-backgrinded dies.

FIG. 10 is a cross-sectional side view showing a stacked system 160 that includes microelectronic die packages 162a-c having corresponding microelectronic dies 164a-c. The die packages 162a-c share a common lateral dimension $d_1$, but the microelectronic dies 164a-c have different lateral dimensions $d_2$, $d_3$, and $d_4$. In one embodiment, the stacked system 160 may be a memory module that includes an interface circuit at the die 164a; a control circuit at the die 164b; and a memory at the die 164c. Because the packages 162a-c share the common lateral dimension $d_1$, a myriad of different types of stacked systems may be created by stacking preferred die packages or exchanging certain die packages. For example, an alternative embodiment of the DRAM-based memory module could be assembled by using smaller magnetoresistive RAM (MRAM) based dies housed in die packages having the lateral dimension $d_1$. Accordingly, DRAM-based die packages 162b-c could be exchanged for MRAM-based die packages.

Figures 11, 12:
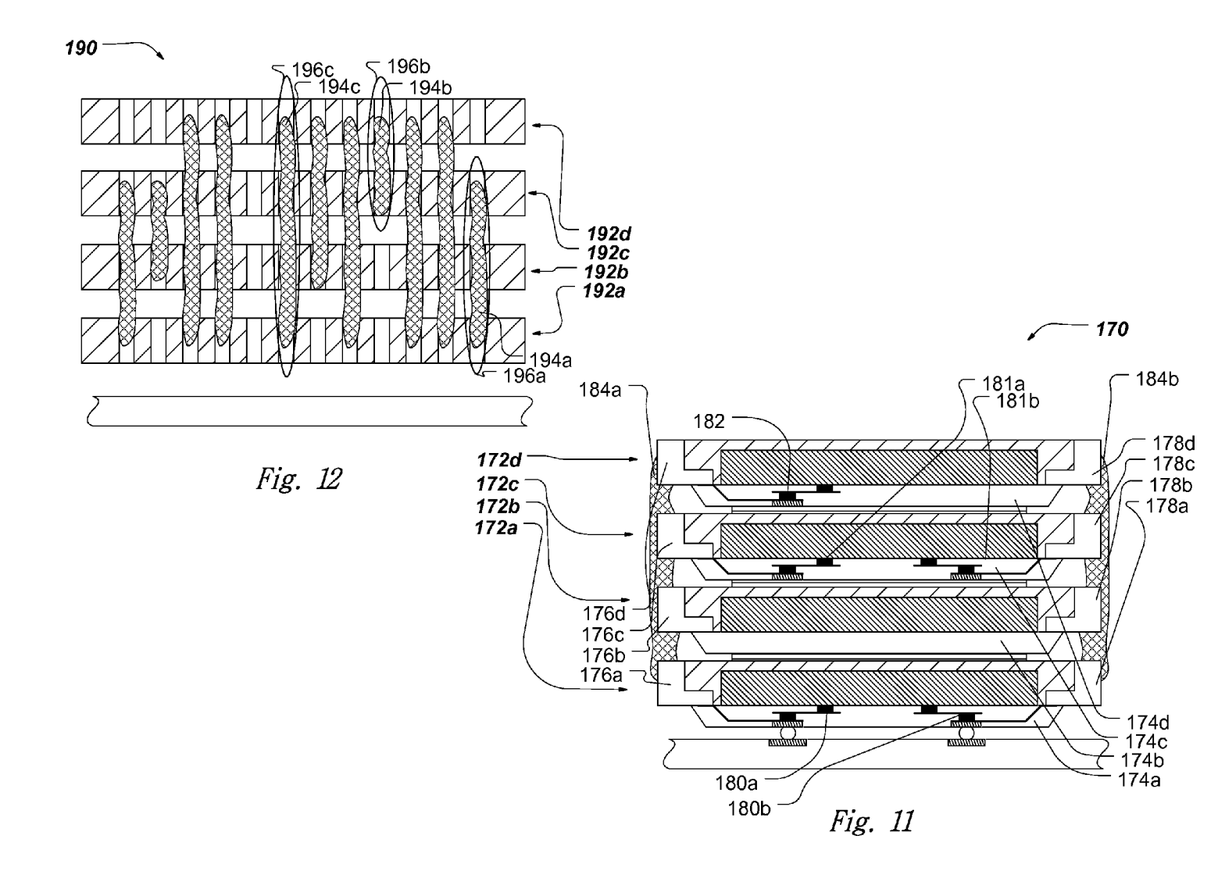
FIG. 11 is a cross-sectional side view of a stacked system having metal traces for selectively electrically coupling individual microelectronic die packages in accordance with an embodiment of the disclosure.
FIG. 12 is a cross-sectional side view of a stacked system having metal solder connectors configured for selectively electrically coupling individual microelectronic die packages in accordance with an embodiment of the disclosure.

FIG. 11 is a cross-sectional side view showing a stacked system 170 that includes microelectronic die packages 172a-d separated by dielectric spacer layers 174a-d and having corresponding first metal leads 176a-d and second metal leads 178a-d respectively coupled together by first and second connectors 184a-b. In this view, the spacer layer 174a includes corresponding metal traces 180a-b, the spacer layer 174c includes corresponding metal traces 181a-b, the spacer layer 174d includes a single metal trace 182, and the spacer layer 174b includes no corresponding metal traces. The first connector 184a is applied across the first leads 176a-d to selectively electrically couple first, third, and fourth packages 172a, 172c, and 172d; and the second connector 184b is applied across the second leads 178a-d to selectively electrically couple the first and third packages 172a and 172c. Thus, one side of the die package 172d and both sides of the die package 172b are electrically isolated from the connectors 184a-b. The process of stacking the die packages 172a-d can be the same as the process described with reference to FIGS. 1A-B. The process of forming the die packages 172a-d can be similar to the method of manufacturing described with reference to FIGS. 2A-8, but instead of connecting a metal trace to every metal lead, individual metal trace-lead couplings have been omitted.

FIG. 12 is a cross-sectional side view showing a stacked system 190 having microelectronic die packages 192a-d and individual external inter-package connectors 194a-c intercoupling the die packages 192a-d at corresponding sets of leads 196a-c. The connector 194a intercouples the first, second, and third die packages 192a-c at the first set of leads 196a; the connector 194b intercouples the third and fourth die packages 192c-d at the second set of leads 196b; and the connector 194c intercouples the first, second, third, and fourth die packages 192a-d at the third set of leads 196c. The connectors 194a-c can be configured to selectively route individual sets of the leads by applying metal solder across a limited lateral surface portion of packaging casing. Leads that are not soldered to remain electrically isolated from the stacked system 190. Combinations of the techniques illustrated in FIGS. 10-11 may be employed to create a desired stacked system that includes a variety of die packages that perform an aggregated circuit function in other embodiments (i.e., by omitting certain metal traces within the dielectric spacer layers and not forming metal solder connectors at certain metal leads).

Figure 13:
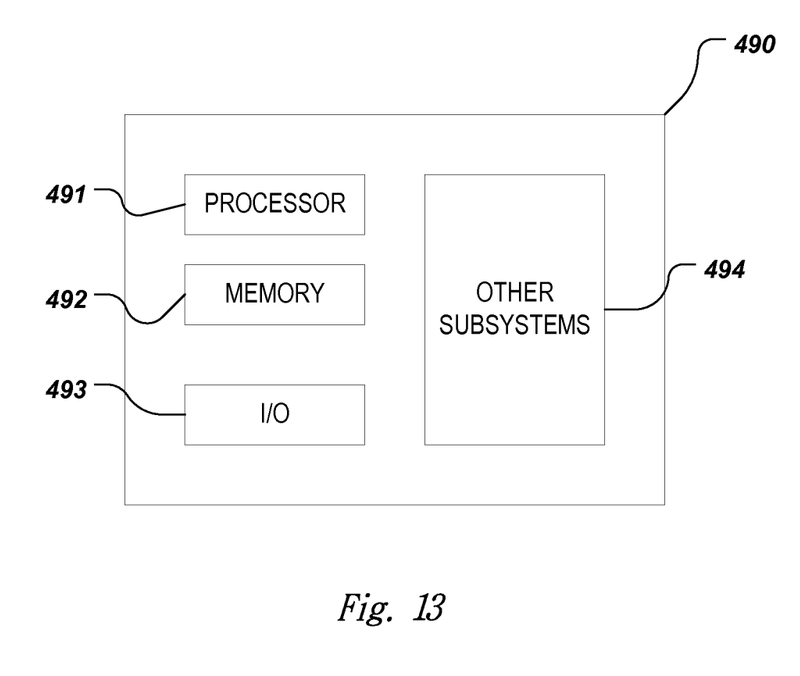
FIG. 13 is a schematic illustration of a system in which the microelectronic die packages and stacked systems may be incorporated.

Any one of the microelectronic devices described above with reference to FIGS. 1A-12 can be incorporated into any of a myriad of larger and/or more complex systems 490, a representative one of which is shown schematically in FIG. 13. The system 490 can include a processor 491, a memory 492 (e.g., SRAM, DRAM, Flash, and/or other memory device), input/output devices 493, and/or other subsystems or components 494. Microelectronic devices may be included in any of the components shown in FIG. 13. The resulting system 490 can perform any of a wide variety of computing, processing, storage, sensor, imaging, and/or other functions. Accordingly, representative systems 490 include, without limitation, computers and/or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and minicomputers. Other representative systems 490 include cameras, light or other radiation sensors, servers and associated server subsystems, display devices, and/or memory devices. In such systems, individual dies can include imager arrays, such as CMOS imagers. Components of the system 490 may be housed in a single unit or distributed over multiple, interconnected units, e.g., through a communications network. Components can accordingly include local and/or remote memory storage devices and any of a wide variety of computer-readable media.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is inclusive and is used throughout to mean including at least the recited feature(s) such that any greater number of the same feature and/or additional types of other features are not precluded. It will also be appreciated that specific embodiments of the invention have been described herein for purposes of illustration, but that various modifications may be made without deviating from the inventions. For example, many of the elements of one of embodiment can be combined with other embodiments in addition to, or in lieu of, the elements of the other embodiments. Accordingly, the invention is not limited except as by the appended claims.

We claim:

1. A stacked system of microelectronic die packages, comprising:
 a first die package including a first die and a first dielectric casing at least partially covering the first die, first lateral sides along the first dielectric casing, and first metal contacts having first lateral contact surfaces along the first lateral sides of the first dielectric casing;
 a second die package including a second die and a second dielectric casing at least partially covering the second die, second lateral sides along the second dielectric casing, and second metal contacts having second lateral contact surfaces along the second lateral sides of the second dielectric casing, wherein the second die package is stacked on top of the first die package and the first metal contacts are at least generally aligned with corresponding second metal contacts;
 a third die package including a third die and a third dielectric casing at least partially covering the third die, third lateral sides along the third dielectric casing, and third metal contacts having third lateral contact surfaces along the third lateral sides of the third dielectric casing wherein the third metal contacts are at least generally aligned with corresponding first metal contacts; and
 metal solder connectors including first-set connectors and second-set connectors, wherein the first-set connectors are coupled to individual first metal contacts and individual second metal contacts, and wherein the second-set connectors are coupled to individual first metal contacts and individual third metal contacts, and wherein at least a portion of the first-set connectors contacts the first and second lateral contact surfaces, and wherein at least a portion of the second-set connectors contacts the first and third lateral contact surfaces, and wherein the first-set connectors are physically and electrically isolated from the individual third metal contacts while the second-set connectors are physically and electrically isolated from the individual second metal contacts.

2. The stacked system of claim 1, wherein at least a portion of the first-set connectors projects laterally outward from the lateral contact surfaces of the first and second casings.

3. The stacked system of claim 1, wherein the first-set connectors further project laterally inward between the first die package and the second die package.

4. The stacked system of claim 1, wherein the first metal contacts further include first top-side contact surfaces and first bottom-side contact surfaces, the second metal contacts further include second top-side contact surfaces and second bottom-side contact surfaces, and wherein individual metal solder connectors of the first-set connectors are further coupled to one of the first top-side surfaces and a corresponding one of the second bottom-side surfaces.

5. The stacked system of claim 1, wherein the first die has a first lateral dimension and the second die has a second lateral dimension different than the first lateral dimension, and wherein the first and second casings have equal lateral dimensions.

6. A computing system, comprising at least one of a processor, a memory, and an input/device, wherein the computing system includes the stacked system according to claim 1.

7. A stacked system of microelectronic die packages, comprising:
a first die package having a first lateral edge and first metal leads having first contact surfaces flush with the first lateral edge;
a second die package having a second lateral edge and second metal leads having second contact surfaces flush with the second lateral edge, wherein the second contact surfaces are generally aligned with the first lateral contact surfaces;
a third die package having a third lateral edge and third metal leads having third contact surfaces flush with the third lateral edge, wherein the third contact surfaces are generally aligned with the first lateral contact surfaces; and
external electrically conductive inter-package connectors, including first-set connectors and second-set connectors, wherein the individual first-set connectors are connected to one of the first contact surfaces and a corresponding second contact surface, and wherein the first-set connectors comprise individual metal solder lines that bridge a first gap between the first die package and the second die package, and wherein the individual second-set connectors are connected to one of the first contact surfaces and a corresponding third contact surface, and wherein the second-set connectors comprise individual metal solder lines that bridge a second gap between the first die package and the third die package, and wherein the first-set connectors are physically and electrically isolated from the corresponding third contact surface while the second-set connectors are physically and electrically isolated from the corresponding second contact surface.

8. The stacked system of claim 7, wherein the first gap spans a lateral distance of up to 60 microns.

9. The stacked system of claim 7, wherein the first die package comprises a first dielectric material that is configured to separate the individual first metal leads apart from each other, and wherein the second die package comprises a second dielectric material that is configured to separate the individual second metal leads apart from each other.

10. The stacked system of claim 9, wherein the first dielectric material has a top-side surface that is configured so that the individual first metal leads are coupled with a top-side of the first die package.

11. The stacked system of claim 9, wherein the second dielectric material has a bottom-side surface that is configured so that the individual second metal leads are coupled with a bottom-side of the second die package.

12. A microelectronic device, comprising:
a molded dielectric material having lateral-side, bottom-side, and top-side surfaces;
a die at least partially encapsulated within the dielectric material and spaced laterally apart from the lateral surface of the dielectric material; and
individual metal leads electrically coupled with the die and the individual metal leads having a wetting surface configured for attaching external inter-package solder lines, wherein the wetting surface includes an exposed metal portion that is flush with the lateral surface of the dielectric material and at least one of the top-side and bottom-side surfaces of the dielectric material, and wherein the external inter-package solder lines include first-set solder lines and second-set solder lines;
wherein the first-set solder lines are coupled to a first external device while the second-set solder lines are coupled to a second external device, and wherein the first-set connectors are physically and electrically isolated from the second external device while the second-set connectors are physically and electrically isolated from the first external device.

13. The microelectronic device of claim 12, further comprising a dielectric spacer layer coupled to a bottom side of the die for electrically isolating active features of the die.

14. The microelectronic device of claim 13, further comprising metal traces for coupling the metal leads to the active features.

15. The microelectronic device of claim 14, wherein the metal traces are configured to selectively electrically couple integrated circuitry of the die with the metal leads.

16. The microelectronic device of claim 12, wherein the top-side surface of the dielectric material is substantially planar for package-to-package stacking.

17. The microelectronic device of claim 12, wherein the metal leads have a lateral thickness that is at least 650 microns.

18. The microelectronic device of claim 12, wherein the dielectric material has a lateral thickness that is at least 650 microns.

* * * * *